(12) United States Patent
Zeiler et al.

(10) Patent No.: US 8,461,616 B2
(45) Date of Patent: Jun. 11, 2013

(54) SEMICONDUCTOR ARRANGEMENT

(75) Inventors: Thomas Zeiler, Nittendorf (DE); Reiner Windisch, Pettendorf (DE); Stefan Gruber, Bad Abbach (DE); Markus Kirsch, Brunn (DE); Julius Muschaweck, Gauting (DE); Torsten Baade, Regensburg (DE); Herbert Brunner, Sinzing (DE); Steffen Köhler, Penang (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 151 days.

(21) Appl. No.: 12/995,181

(22) PCT Filed: Apr. 20, 2009

(86) PCT No.: PCT/DE2009/000542
§ 371 (c)(1),
(2), (4) Date: Feb. 23, 2011

(87) PCT Pub. No.: WO2009/143795
PCT Pub. Date: Dec. 3, 2009

(65) Prior Publication Data
US 2011/0266571 A1    Nov. 3, 2011

(30) Foreign Application Priority Data

May 29, 2008 (DE) .......................... 10 2008 025 756

(51) Int. Cl.
*H01L 31/048* (2006.01)
(52) U.S. Cl.
USPC ............... 257/99; 257/98; 257/100; 257/459; 257/E33.062; 257/E33.073; 257/E31.124; 257/E31.127
(58) Field of Classification Search
USPC ............. 257/98–100, 432, 459, E33.062, 257/E33.073, E31.124, E31.127
See application file for complete search history.

(56) References Cited

U.S. PATENT DOCUMENTS

| 5,216,805 | A  | * | 6/1993  | Hallenbeck et al. ............ 29/840 |
| 6,345,903 | B1 |   | 2/2002  | Koike et al. |
| 6,911,392 | B2 | * | 6/2005  | Bieck et al. .................... 438/667 |
| 7,455,461 | B2 | * | 11/2008 | Hohn et al. ...................... 385/93 |
| 7,700,957 | B2 | * | 4/2010  | Bieck et al. ...................... 257/82 |
| 7,923,793 | B2 | * | 4/2011  | Choi et al. ..................... 257/415 |
| 2003/0113979 | A1 | * | 6/2003 | Bieck et al. ................... 438/411 |
| 2004/0061120 | A1 |   | 4/2004 | Mizuyoshi |
| 2005/0093430 | A1 |   | 5/2005 | Ibbetson et al. |
| 2005/0269582 | A1 |   | 12/2005 | Mueller et al. |
| 2005/0280016 | A1 |   | 12/2005 | Mok et al. |
| 2006/0175625 | A1 |   | 8/2006  | Yokotani et al. |
| 2007/0138494 | A1 |   | 6/2007  | Pugh et al. |
| 2007/0152231 | A1 | * | 7/2007 | Destain .......................... 257/99 |
| 2007/0187711 | A1 | * | 8/2007 | Hsiao et al. ................... 257/100 |
| 2008/0116467 | A1 |   | 5/2008  | Mueller et al. |
| 2008/0258168 | A1 | * | 10/2008 | Loh et al. ........................ 257/99 |
| 2009/0135581 | A1 |   | 5/2009  | Yano et al. |
| 2010/0176475 | A1 | * | 7/2010 | Sano et al. .................... 257/432 |
| 2011/0260195 | A1 | * | 10/2011 | Chakraborty et al. .......... 257/98 |

FOREIGN PATENT DOCUMENTS

| CN | 1922740    | 2/2007 |
| DE | 196 25 622 | 1/1998 |

(Continued)

*Primary Examiner* — Allan R Wilson
(74) *Attorney, Agent, or Firm* — Cozen O'Connor

(57) ABSTRACT

According to at least one embodiment of the semiconductor arrangement, the latter comprises a mounting side, at least one optoelectronic semiconductor chip with mutually opposing chip top and bottom, and at least one at least partially radiation-transmissive body with a body bottom, on which the semiconductor chip is mounted such that the chip top faces the body bottom. Moreover, the semiconductor arrangement comprises at least two electrical connection points for electrical contacting of the optoelectronic semiconductor chip, wherein the connection points do not project laterally beyond the body and with their side remote from the semiconductor chip delimit the semiconductor arrangement on the mounting side thereof.

13 Claims, 3 Drawing Sheets

| | FOREIGN PATENT DOCUMENTS | |
|---|---|---|
| DE | 10 2004 036 157 | 2/2006 |
| DE | 10 2006 037 737 | 6/2007 |
| DE | 10 2007 019 775 | 10/2008 |
| DE | 10 2007 019 776 | 10/2008 |
| EP | 1 191 608 | 3/2002 |
| JP | 2001 203396 | 7/2001 |
| JP | 2002-176200 | 6/2002 |
| JP | 2004-281606 | 10/2004 |
| TW | 200620718 | 6/2006 |
| WO | WO 2006/034703 | 4/2006 |
| WO | WO 2006/114745 | 11/2006 |
| WO | WO 2007/069198 | 6/2007 |
| WO | WO 2008/131743 | 11/2008 |

\* cited by examiner

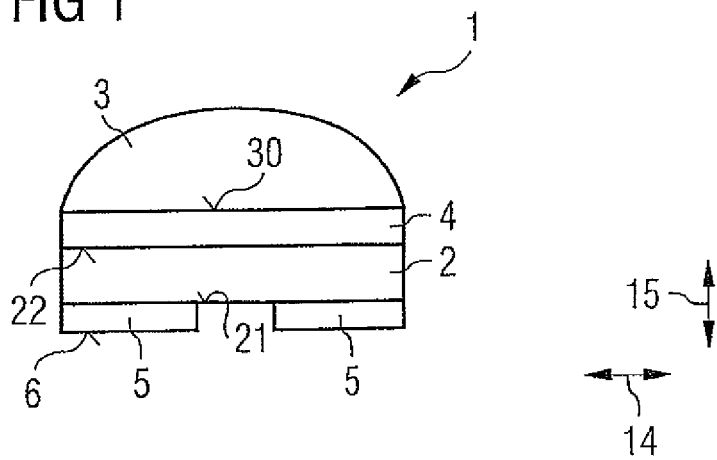
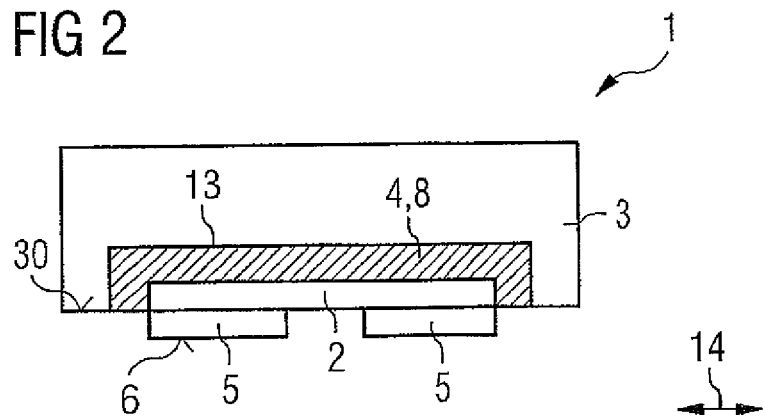
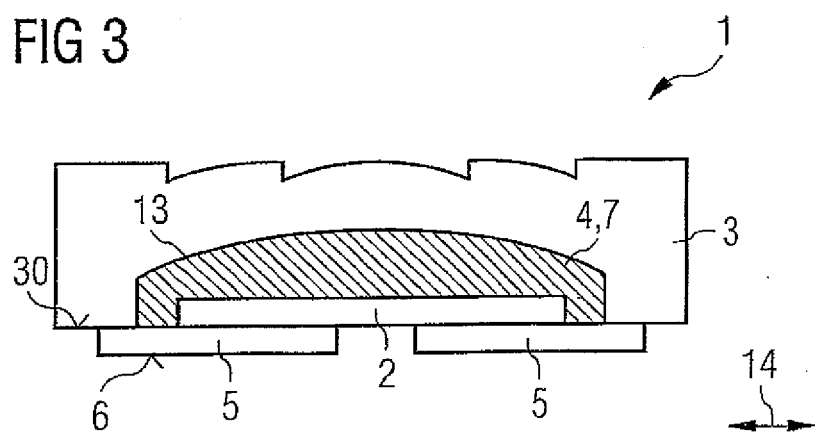

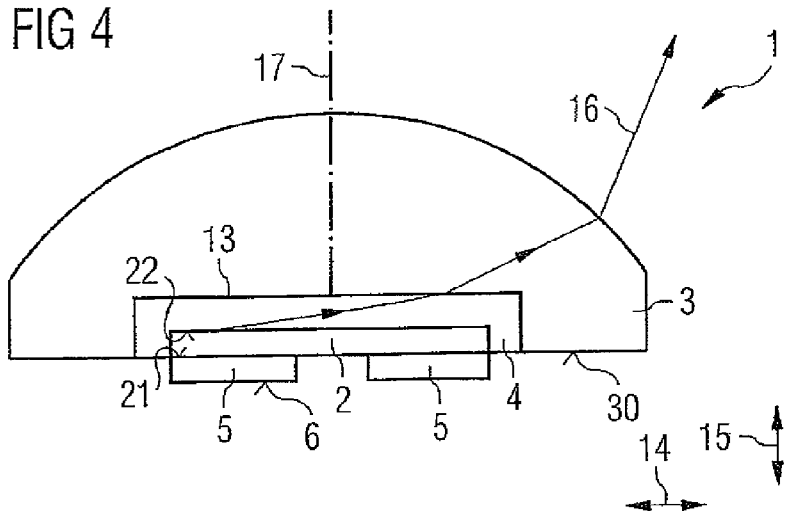
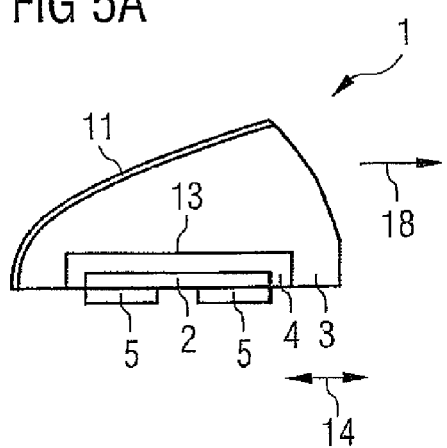
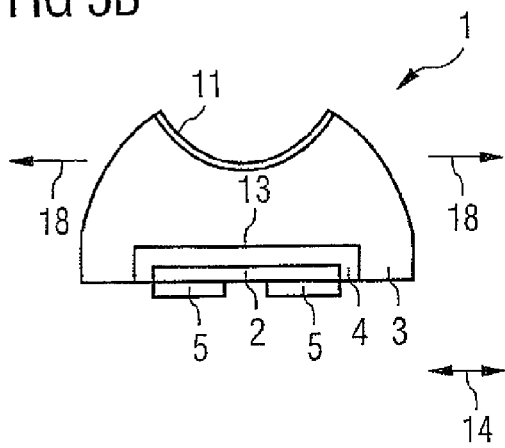
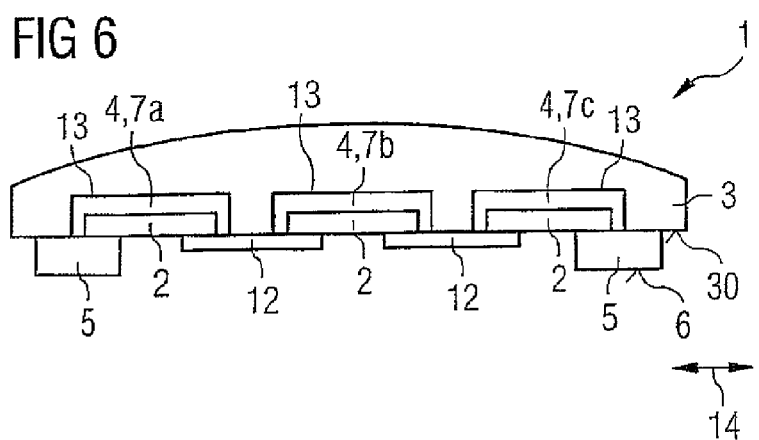

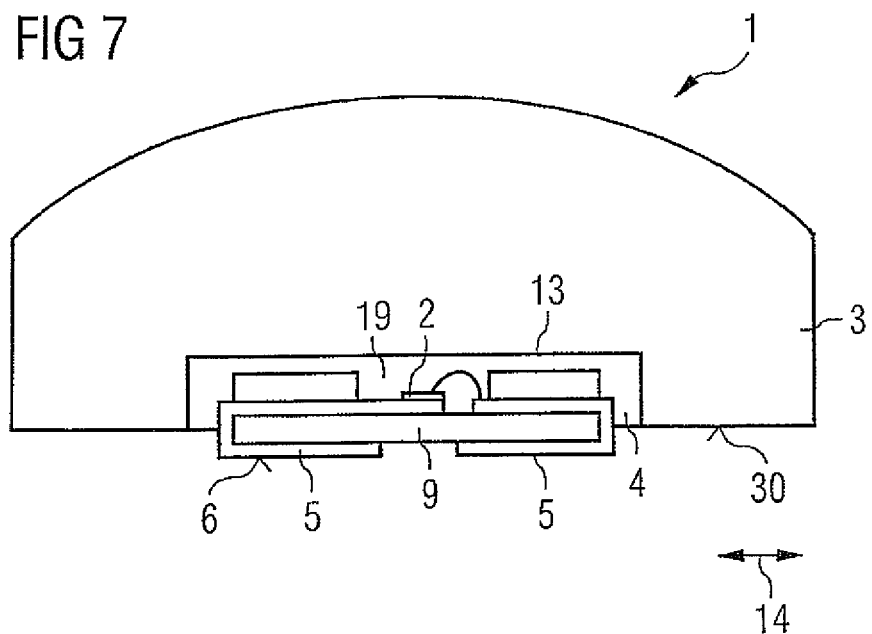
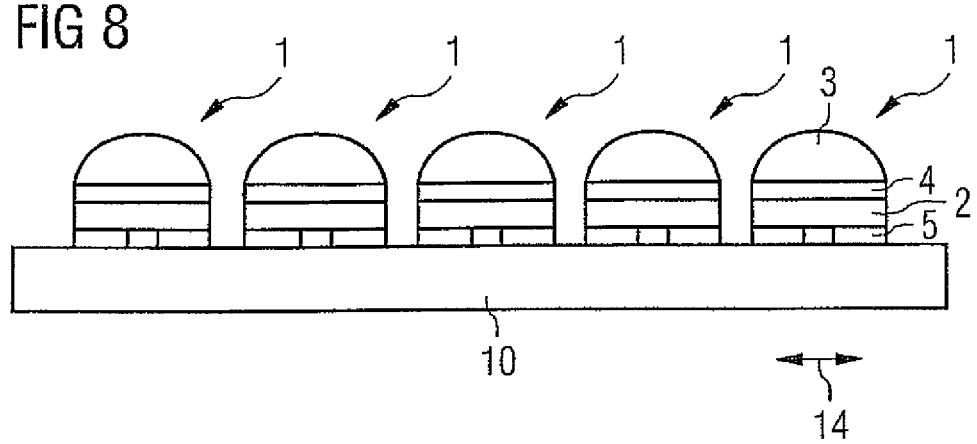

SEMICONDUCTOR ARRANGEMENT

RELATED APPLICATIONS

This is a U.S. national stage of application No. PCT/DE2009/000542, filed on Apr. 20, 2009, and claims priority on German application No. 10 2008 025 756.7, filed on May 29, 2008, the entire content of which is hereby incorporated by reference.

FIELD OF THE INVENTION

The present invention is directed to a semiconductor arrangement with an optoelectronic semiconductor chip.

BACKGROUND OF THE INVENTION

Optoelectronic semiconductor chips for instance in the form of photodiodes or of light-emitting diodes have become widely used in recent years. Some of the aspects which are encouraging more widespread use of optoelectronic semiconductor chips are their high efficiency, robustness against external environmental influences such as for example moisture or mechanical stress, long service life, compact structure and wide variety of configuration options, these all being achieved with comparatively favourable manufacturing costs. Something which is often decisive with regard to these characteristics is the housing of the semiconductor chip, to which considerable attention is therefore generally paid.

Some fields of application in which optoelectronic semiconductor chips and in particular light-emitting and laser diodes dominate are for instance backlighting of displays or display means. Optoelectronic semiconductor chips are also increasingly being used in lighting devices for projection purposes, in floodlights or spotlights or for general lighting.

SUMMARY OF THE INVENTION

An object to be achieved is to provide a semiconductor arrangement which exhibits particularly good optical properties and requires only a small amount of space.

According to at least one embodiment of the semiconductor arrangement, the latter comprises a mounting side, by means of which the semiconductor arrangement is connected to an external carrier which is not part of the semiconductor arrangement carrier, such as for instance a printed circuit board or a ceramic material.

According to at least one embodiment of the optoelectronic semiconductor component, the latter comprises at least one optoelectronic semiconductor chip. The semiconductor chip comprises a chip top and a chip bottom, which are substantially opposite one another. The semiconductor chip comprises for example a light-emitting diode or a laser diode, which emits light for instance in the near UV, in the visible or in the near infrared spectral range. It is also possible for the semiconductor chip to be configured for example as a sensor for instance in the form of a photodiode for example for visible or near infrared light.

The semiconductor chip may be designed for example as a flip-chip or as a thin film chip. The contact points of the chip, by way of which the latter is electrically contacted, may be limited to the chip bottom, but may also be located on the chip top and the chip bottom.

According to at least one embodiment of the optoelectronic semiconductor component, the latter comprises an at least partially radiation-transmissive body, i.e. the body is transparent or transmissive in particular for at least part of the radiation to be received or emitted by the semiconductor chip. The body comprises a body bottom, on which the semiconductor chip is mounted. The top of the semiconductor chip faces at least some of the body bottom. The body bottom may be substantially flat or indeed comprise structures, such as for instance recesses. The semiconductor chip may be in direct contact with the body bottom or indeed be mounted thereon by way of at least one interlayer.

According to at least one embodiment of the semiconductor arrangement, the latter comprises at least two electrical connection points, which serve to contact the optoelectronic semiconductor chip electrically. The connection points may be an integral part of the semiconductor chip, or they may also be mounted as separate components on the chip, either in direct contact therewith or by means of an intermediate carrier. The connection points do not project laterally beyond the radiation-transmissive body. In other words the connection points do not protrude beyond the radiation-transmissive body in directions along the chip bottom and/or the body bottom. This means that the largest lateral extent of the semiconductor arrangement, for instance parallel to the chip bottom, is provided by the radiation-transmissive body or by the semiconductor chip. In addition, the connection points delimit the semiconductor arrangement in the direction of the mounting side thereof, i.e. neither the radiation-transmissive body nor the semiconductor chip protrudes beyond the connection points in the direction of the mounting side. In other words, the semiconductor arrangement is delimited by the connection points in transverse directions relative to the chip bottom and/or body bottom.

According to at least one embodiment of the optoelectronic semiconductor component, the latter is surface-mountable. This means that, when the semiconductor arrangement is connected for example to an external carrier, no vias through the external carrier are necessary, for instance in the form of solder pins. On connection, the semiconductor arrangement is preferably placed onto a surface for example of the external carrier, without penetrating this surface, before a mechanical connection is provided between carrier and semiconductor arrangement for instance by means of soldering or adhesive bonding. Such a semiconductor arrangement simplifies mounting of the semiconductor arrangement. In addition, the operations involved in configuring an external carrier, for instance, may be reduced.

In at least one embodiment of the semiconductor arrangement, the latter comprises a mounting side, at least one optoelectronic semiconductor chip with mutually opposing chip top and bottom, and at least one at least partially radiation-transmissive body with a body bottom, on which the semiconductor chip is mounted such that the chip top faces the body bottom. Moreover, the semiconductor arrangement comprises at least two electrical connection points for electrical contacting of the optoelectronic semiconductor chip, wherein the connection points do not project laterally beyond the body and, with their side remote from the semiconductor chip, delimit the semiconductor arrangement on the mounting side thereof, and wherein the semiconductor arrangement is surface-mountable.

Such a semiconductor arrangement makes it possible, inter alia, to produce very compact, space-saving components, for example because the lateral extent of the semiconductor arrangement may be delimited by the lateral extent of the radiation-transmissive body. Owing to the small number of components of the semiconductor arrangement, they may also be produced efficiently and with reduced manufacturing costs. At the same time it is ensured that the specific configuration of the semiconductor arrangement may be handled flexibly.

According to at least one embodiment of the semiconductor arrangement, the semiconductor chip is connected with the prefabricated radiation-transmissive body by an at least in part radiation-transmissive adhesive joint. Preferably, the adhesive joint provides a permanent connection between the semiconductor chip and the body, i.e. under normal operating conditions the adhesive joint does not become undone during the lifetime of the semiconductor arrangement. Adhesive joints are easy to produce industrially. The mechanical properties and geometric dimensions thereof may be adjusted within a wide range of parameters. If the adhesive joint comprises at least in part for instance a silicone, which has a degree of mechanical flexibility even when cured, thermal stresses, which are caused by operation of the optoelectronic semiconductor chip, may be buffered relative to the radiation-transmissive body. The thickness of the adhesive joint may, depending on the specific requirements of the desired application, amount to a few micrometres up to several hundred micrometres. Further possible materials for the adhesive joint are epoxy resins and hybrid materials of epoxy and silicone. As with the radiation-transmissive body, the adhesive joint is preferably ageing-resistant relative to radiation and thermal stresses which result from operation of the semiconductor arrangement.

According to at least one embodiment of the semiconductor arrangement, the chip bottom is free of an adhesive joint, i.e. the adhesive joint is limited to the chip top and the side faces of the chip. In this case, the side faces are the defining faces of the semiconductor chip oriented for example perpendicularly to the chip bottom or the chip top and which connect the chip top and chip bottom together. Such an adhesive joint ensures good mechanical and optical contact between semiconductor chip and radiation-transmissive body, and the semiconductor chip itself is well protected from external influences by the adhesive joint and/or body.

According to at least one embodiment of the semiconductor arrangement, the adhesive joint is limited to the chip top. This has the consequence that the side faces of the semiconductor chip are free of the adhesive joint, so making possible semiconductor arrangements which take up a particularly small amount of space laterally.

According to at least one embodiment of the semiconductor arrangement, the connection points thereof are SMT contactable. Surface Mount Technology, or SMT for short, is a technology designed to contact electronic components with small dimensions, i.e. with lateral dimensions of the order of magnitude of 1 mm, electrically with a carrier, such as for instance a printed circuit board, or to attach them thereto. The connection points are preferably made of a metal, which is connectable by means of soldering. It is also preferable for the semiconductor arrangement to be constructed such that it is resistant to the thermal stresses arising during a soldering process. A semiconductor arrangement which is SMT-processable with such connection surfaces opens up a wide range of applications and uses. In addition, SMT contacting provides a particularly efficient and cost-effective possibility for attaching the semiconductor arrangement even when associated with other electronic components, for example by means of soldering by heating in a furnace, to a carrier or electrically contacting it, in particular since as a rule no vias through the carrier are needed.

According to at least one embodiment of the semiconductor arrangement, the connection points do not project laterally, i.e. in a direction parallel to the chip bottom, beyond the semiconductor chip. As a result of such a configuration of the connection surfaces, particularly compact semiconductor arrangements may be produced and high-density packing of semiconductor arrangements on a carrier, for example a metal-core board, is possible.

According to at least one embodiment of the semiconductor arrangement, the connection points are mounted directly on the chip bottom. The connection points may be made in one piece with the semiconductor chip and be an integral part of the chip, such that the connection points are actually manufactured during the process of producing the semiconductor chip itself. Possible materials for connection points are metals which allow relatively easy contacting of the connection points using soldering processes and which may also at the same time serve as reflective surfaces for radiation emitted by the semiconductor chip or to be received thereby.

Furthermore, it is possible for the connection points to be made from a transparent material, for instance a metal oxide such as indium-tin oxide, ITO for short, such that they are substantially transmissive for radiation to be received by the semiconductor chip or emitted thereby.

Furthermore, the connection points are preferably oriented substantially parallel to the chip bottom. As a result of the connection points being oriented parallel, within the bounds of manufacturing accuracy, to the semiconductor chip, an arrangement which is particularly space-saving in the vertical direction may be achieved.

Moreover, the connection points are preferably of large-area configuration. If the connection points are of large-area configuration, they cover in particular some of the bottom of the semiconductor chip. For example, the connection points then cover at least 40%, preferably at least 70%, particularly preferably at least 90% of the chip bottom. In this way, good electrical and thermal contact is ensured between semiconductor chip and an external carrier. In addition, large-area connection points simplify contacting of the semiconductor arrangement, since the manufacturing tolerances for contacting are then correspondingly greater.

According to at least one embodiment of the semiconductor arrangement, the body bottom is provided with a recess, in which the semiconductor chip is at least partially located, i.e. the semiconductor chip may project out of the recess towards the body bottom or project in part laterally beyond the recess. The defining faces of the body formed by the recess are regarded as belonging to the body bottom. In addition, the body surrounds the semiconductor chip on all sides, with the exception of the bottom thereof. As a result of such a recess, the semiconductor chip may for instance be positioned particularly simply and precisely relative to the radiation-transmissive body.

According to at least one embodiment of the semiconductor arrangement, the lateral extent of the radiation-transmissive body deviates by less than 40% from the lateral extent of the semiconductor chip, preferably less than 20%, particularly preferably less than 10%, in particular the lateral extents of body and semiconductor chip are identical within the bounds of manufacturing tolerances. The deviation of the lateral extents from one another is here defined by the ratio of the dimension of the body in a direction parallel to the chip bottom, to the dimension of the semiconductor chip in the same direction, wherein all directions parallel to the chip bottom should be taken into consideration. The semiconductor chip is stabilised mechanically by means of the radiation-transmissive body, such that it is easy to handle, in particular position, the semiconductor arrangement for instance using forceps or other tools.

According to at least one embodiment of the semiconductor arrangement, the chip bottom is freely accessible at least in places. This means that the chip bottom does not for example adjoin a housing of the semiconductor arrangement. This makes handling particularly easy for the purposes of subsequent manufacturing and mounting processes. Such an arrangement also makes it possible to diagnose any malfunctions of the semiconductor arrangement and optionally to remedy them.

According to at least one embodiment of the semiconductor arrangement, the adhesive joint is transmissive for the radiation emitted or to be received by the semiconductor chip, i.e. the adhesive joint is not significantly absorbent in the relevant spectral range. This means that at least 80%, and preferably more than 95%, of the radiation is transmitted by the adhesive joint. Such a configuration of the adhesive joint makes possible a particularly efficient component.

According to at least one embodiment of the semiconductor arrangement, the adhesive joint comprises a filter medium, which absorbs part of the radiation emitted or to be received by the semiconductor chip. If in particular the semiconductor chip takes the form of a sensor, the free spectral range may be limited as required by a suitable filter medium, such that the semiconductor chip receives for instance only narrowband near infrared radiation. Filter media may be pigments or dyes, which are added to the adhesive joint. A plurality of dyes may for instance also be combined with one another. Since a large selection of pigments or dyes is available for industrial use, this offers an easily implemented option for integrating a filter medium in the semiconductor arrangement.

According to at least one embodiment of the semiconductor arrangement, the adhesive joint or the radiation-transmissive body contain scattering media, which have a scattering effect on the radiation emitted or to be received by the semiconductor chip. Such scattering media may for instance take the form of aluminium oxide or titanium dioxide. The adhesive joint or the body are then for instance milky and act as diffusers, such that the radiation is emitted uniformly, for instance in the manner of a Lambertian radiation, by the surface of the semiconductor arrangement. Punctiform loading of the semiconductor chip, if the latter takes the form for example of a photodiode, is also stopped, so giving rise to more uniform illumination of the semiconductor chip and thus for example a better signal-to-noise ratio.

According to at least one embodiment of the semiconductor arrangement, radiation-transmissive body or adhesive joint comprise a conversion medium, which converts at least part of the radiation emitted or to be received by the semiconductor chip into radiation of a different frequency. Such conversion media may for instance be luminescent light-emitting materials. Such light-emitting materials make it possible to convert for instance the light of a blue-emitting semiconductor chip into substantially white light. It is likewise possible for the conversion medium to take the form for instance of a crystal, which for instance doubles or triples the frequency of the radiation emitted by the semiconductor chip. Moreover, the conversion medium may also take the form of a photonic crystal or a similarly acting optically active medium. It is for example possible by using conversion media to use efficient, inexpensive components such as for instance blue-emitting light-emitting diodes based on GaN in order also to generate radiation for instance for a lighting device which is tunable in virtually the entire visible spectral range.

According to at least one embodiment of the semiconductor arrangement, at least one of the admixtures, for example the conversion medium, is distributed non-homogeneously in the radiation-transmissive body or in the adhesive joint. This means that conversion medium concentrations differ at different locations in the body or in the adhesive joint. For example, the radiation-transmissive body may comprise a higher conversion medium concentration over the semiconductor chip in the laterally middle regions than in the edge regions. As a result of a higher conversion medium concentration over the middle of the semiconductor chip it is possible, if the semiconductor chip takes the form for instance of an LED, to ensure a particularly uniform spectrally homogeneous emission of the semiconductor arrangement over the entire surface of the radiation-transmissive body. It is also possible for different admixtures, such as for instance conversion, filter or scattering media, to be accommodated within the body or the adhesive joint. The body for instance may likewise contain for instance a different admixture from the adhesive joint.

According to at least one embodiment of the semiconductor arrangement, the adhesive joint is non-homogeneous in thickness. The adhesive joint, in which a conversion medium is for example admixed with a constant concentration, comprises a greater thickness for instance over the laterally middle region of the chip top than at the edge regions. Such an arrangement may in turn ensure spectrally homogeneous emission of the semiconductor arrangement over the entire top thereof. Such a non-homogeneous thickness may readily be brought about by way of the shaping of the radiation-transmissive body, in particular by way of the shape of a recess, in which the semiconductor chip may be located.

According to at least one embodiment of the semiconductor arrangement, the optical refractive index of the adhesive joint is lower than that of the body. If the semiconductor chip takes the form of a light-emitting diode, which comprises for example materials such as gallium nitride or phosphorus nitride, the refractive index of the semiconductor chip is typically relatively large and amounts generally to between 2 and 3. The optical refractive index of silicones or epoxies amounts, depending on composition, to the range between 1.4 and 1.7. The refractive index of the adhesive joint may thus normally be established such that it is lower than that of the semiconductor chip and that of the radiation-transmissive body. Since the refractive index of the adhesive joint is lower than that of the body, light emitted by the semiconductor chip undergoes an action similar to that of a convergent lens at the interface between the adhesive joint and the body.

According to at least one embodiment of the semiconductor arrangement, the radiation-transmissive body is of lens-like configuration. Lens-like means that the surface remote from the semiconductor chip, or at least part thereof, has the form for instance of a concave or convex lens. The shape does not here have to correspond precisely to that of a lens. In addition, the lens does not have to be spherical or rotationally symmetrical, but rather may also take the form for instance of a cylinder lens. It is also possible to use "flat" geometries such as for instance Fresnel lenses.

According to at least one embodiment of the semiconductor arrangement, at least one reflective layer is applied at least in part to the radiation-transmissive body. The reflective layer may also have a reflective effect solely for a specific spectral range or indeed be of semi-transparent configuration. It is possible in particular, if the body is only partially coated and the body top is appropriately formed, for a semiconductor arrangement to be obtained which mainly emits radiation in a direction perpendicular to the chip top.

According to at least one embodiment of the semiconductor arrangement, the semiconductor chip is mounted on at least one intermediate carrier. The intermediate carrier may for instance be made of a ceramic or of a rewiring plane. By means of such an arrangement the semiconductor chip may be completely enclosed and thus very well protected against environmental influences. It is also particularly straightforwardly possible in this way to accommodate a plurality of semiconductor chips in the semiconductor arrangement.

According to at least one embodiment of the semiconductor arrangement, the latter does not comprise any further components apart from the semiconductor chip, the radiation-transmissive body and the connection points. Admixtures in adhesive joint or body are not ruled out here, however. Limitation to these components makes it possible to produce semiconductor arrangements particularly efficiently.

According to at least one embodiment of the semiconductor arrangement, the radiation-transmissive body and the semiconductor chip are made separately. The radiation-transmissive body may be produced by means of casting, injection moulding, die casting, liquid injection moulding, liquid compression moulding or compression moulding. The semiconductor chip may be epitaxially grown and is preferably separated from the growth substrate before mounting. Particularly preferably, the semiconductor chips are in singulated form.

Assembly of the semiconductor chip and the body may comprise the following steps:
  providing or producing the body,
  providing or producing the semiconductor chip,
  positioning the body in such a way that the body bottom thereof points upwards,
  applying a material forming the adhesive joint to the body bottom, the body bottom pointing vertically upwards, and
  applying or impressing the semiconductor chip into the material forming the adhesive joint, the chip top facing the body bottom.

The material forming the adhesive joint preferably has a high-viscosity consistency on application of the semiconductor chip. Optionally a protective film or a protective layer may be applied to the chip bottom, which is remote from the body, such that the semiconductor chip is not damaged during application or impressing and/or is not for instance wetted by the material.

BRIEF DESCRIPTION OF THE DRAWINGS

The semiconductor arrangement described will be explained in greater detail below with reference to the drawings and with the aid of exemplary embodiments. Elements which are the same in the individual figures are indicated with the same reference numerals. The features shown on the drawings are, however, not to scale relative to one another. Rather, individual elements may be illustrated on an exaggeratedly large scale for better comprehension.

In the drawings:

FIG. 1 is a schematic side view of an exemplary embodiment of a semiconductor arrangement, FIG. 2 is a schematic side view of a further exemplary embodiment of a semiconductor arrangement, FIG. 3 is a schematic sectional representation of a semiconductor arrangement with non-homogeneous thickness of the adhesive joint, FIG. 4 is a schematic sectional representation of a further exemplary embodiment, FIG. 5a, b is a schematic sectional representation of an exemplary embodiment with a reflective layer applied to the radiation-transmissive body, FIG. 6 is a schematic sectional representation of an exemplary embodiment with a plurality of semiconductor chips, FIG. 7 is a schematic sectional representation of an exemplary embodiment with an intermediate carrier, and FIG. 8 shows a schematic side view of an arrangement of a plurality of semiconductor arrangements on a carrier.

DETAILED DESCRIPTION OF THE DRAWINGS

FIG. 1 shows an exemplary embodiment of a semiconductor arrangement 1. The semiconductor chip 2 takes the form of a blue-emitting light-emitting diode based on GaN. There are no strict limits on the geometric dimensions of the semiconductor chip 2. Preferably the extent in the lateral direction 14, i.e. parallel to a chip bottom 21, amounts to approx. 0.5 to 3 mm$^2$ and its thickness to 50 to 300 μm. Two electrical connection points 5 are mounted on the chip bottom 21. The connection points 5 are in direct contact with the chip bottom 21. The chip top 22 is covered with an adhesive joint 4, which permanently connects semiconductor chip 2 and a radiation-transmissive body 3 together mechanically. The adhesive joint 4 is made from a transparent material which is ageing-resistant relative to the radiation emitted by the semiconductor chip 2, such as for example silicone or a silicone-epoxy hybrid material. The body 3 is spherical in shape like a convex lens and transmissive for the radiation emitted by the semiconductor chip 2.

Simple options for producing such a body 3 are casting methods such as for example compression moulding. The material of the body 3 is thermoplastic, for instance. Materials from the group of silicones, epoxies, polycarbonates or hybrid materials may also be used. Likewise, the body 3 may be made of glasses. The material is preferably resistant to the environmental influences resulting from the specific application and ageing-resistant relative to the radiation to be received or emitted by the semiconductor chip 2.

In this exemplary embodiment, the extent in a lateral direction 14 of the semiconductor arrangement 1 is identical to the extent in the lateral direction 14 of the semiconductor chip 2, i.e. the electrical connection points 5 and the adhesive joint 4 and also the body 3 do not project beyond the semiconductor chip 2 in the lateral direction 14, i.e. parallel to the chip bottom 21. The semiconductor arrangement 1 is also defined by the sides of the connection points 5 remote from the semiconductor chip 2 with regard to a mounting side 6. The mounting side 6 is oriented substantially parallel to the chip bottom 21.

A further exemplary embodiment is shown in FIG. 2. The semiconductor arrangement 1 in this case comprises a semiconductor chip 2, which takes the form for example of a sensor for instance for near infrared radiation. Two metallic connection points 5 are located on the chip bottom 21, Surface Mount Technology, SMT for short, being used to mount these on an external carrier, not shown, by means for instance of soldering or adhesive bonding. The connection points in turn define the semiconductor arrangement 1 at the bottom in the direction of the mounting side 6. An adhesive joint 4 made of a transparent silicone is applied to the chip top 22 and on the side faces of the semiconductor chip 2. Said joint comprises a filter medium 8 distributed homogeneously therein. The filter medium 8 may be selected such that higher frequency, visible radiation fractions are filtered, such that the semiconductor chip 2 configured as a sensor is for instance only accessible to near infrared radiation. Optionally the semiconductor chip 2 may also be for instance a light-emitting diode, which emits electromagnetic radiation when in operation. Instead of the filter medium 8 it is alternatively or additionally possible to use a scattering or conversion medium 7.

The semiconductor chip 2 has a square outline in this exemplary embodiment. The radiation-transmissive body 3 has a rectangular cross-section in plan view, is provided at the body bottom 30 with a recess 13 and surrounds the semiconductor chip 2 laterally at just two mutually opposing side faces, such that on the one hand the space requirement in the lateral direction 14 is minimised and on the other hand the semiconductor chip 2 may be well positioned in the recess 13 in the body. The recess 13 at the body bottom 30 is dimensioned such that the semiconductor chip finds space therein and in addition the desired layer thickness of the adhesive joint 4 is established. The recess 13 may be simply produced during production of the body 3, for instance for the purposes of a casting process.

A transparent silicone is used as the material for the radiation-transmissive body 3. The top of the body 3 is flat in shape and scratch-resistant due to the mechanical properties of the silicone used, which may optionally comprise a coating. In this way the semiconductor arrangement 1 constitutes a good Lambertian emitter. The electrical connection points 5 cover part of the chip bottom 21 and form with the side facing the semiconductor chip 2 a surface reflecting the radiation to be detected by the semiconductor chip 2 or emitted thereby. In the lateral direction 14 the connection points 5 end flush with the semiconductor chip 2.

Alternatively, the electrical connection points 5 may also be made from a transparent material for instance from the group of Transparent Conductive Oxides, TCOs for short, such as for instance ITO. This is particularly advantageous if the external carrier, on which the semiconductor arrangement 1 is mounted, is likewise transmissive for the relevant radiation.

FIG. 3 shows a further exemplary embodiment. The semiconductor chip 2 takes the form for instance of a laser or light-emitting diode and emits light when in operation. In this exemplary embodiment the connection points 5 project in the lateral direction 14 beyond the semiconductor chip 2 but not beyond the radiation-transmissive body 3. The side of the extensive connection points 5 facing the semiconductor chip 2 ends in a vertical direction 15 flush with the body 3. Apart from the chip bottom 21, the semiconductor chip 2 is surrounded by the adhesive joint 4. Over the chip top 22 the adhesive joint 4 comprises a non-homogeneous thickness, in such a way that over the region of the semiconductor chip 2 in the middle in the lateral direction 14 the thickness is greater than at the edge areas. In the adhesive joint 4 a conversion medium 7 is introduced in a concentration remaining the same over the entire adhesive joint 4. Due to the greater thickness of the adhesive joint 4 over the central region of the semiconductor chip 2, a greater quantity of conversion medium 7 is likewise located there, such that overall more uniform emission with better spectral homogeneity is obtained over the entire chip top 22. The non-homogeneous layer thickness of the adhesive joint 4 is established automatically by adhesively bonding the semiconductor chip 2 into the body 3, since the body 3 consisting of a transparent ageing-resistant material comprises a lens-like recess 13 on the body bottom 30, in which the semiconductor chip 2 is substantially located. The top of the radiation-transmissive body 3 takes the form of a Fresnel lens. The body 3 surrounds the semiconductor chip 2 on all side faces.

FIG. 4 shows a further exemplary embodiment. The radiation-transmissive body 3 is in this case significantly larger in the lateral direction 14 than the semiconductor chip 2 located in a recess 13 in the body bottom 30, so as to achieve higher quality optical imaging. The electrical connection points 5 are again mounted directly on the chip bottom 21 and do not project beyond the semiconductor chip 2 in the lateral direction 14. The transparent adhesive joint 4 is made of a silicone, which has a refractive index of around 1.4. The body 3, shaped in the manner of a convex lens, is made of polycarbonate with a refractive index of around 1.6, such that the refractive index of the adhesive joint is lower than that of the body. The beam path 16 of a photon emitted by the semiconductor chip 2 is shown schematically as a line with arrows. The photon is emitted at the edge of the chip top 22 and passes at a small angle through the adhesive joint 4. At the interface between adhesive joint 4 and body 3 refraction takes place in such a way that the photon is deflected away from the chip top 22 in the vertical direction 15. In this way such photons are then imaged better by the radiation-transmissive body 3, since they impinge on the body-air interface closer to the optical axis of the body 3.

In the exemplary embodiment according to FIG. 5a the top of the radiation-transmissive body 3 is provided in places with a reflective layer 11. The reflective layer 11 is in this case of paraboloid configuration due to the shaping of the body 3. The surface of the body 3 not covered by the reflective layer 11 is shaped like a lens. As a result of this configuration of the body 3, one option for light which is emitted by the semiconductor chip 2, which takes the form of an LED, is for it to be transmitted directly from the body, wherein the radiation is emitted substantially in the direction of arrow 18 due to the lens-like structure of the body 3. Light which impinges on the reflective layer 11 is then deflected thereby likewise substantially in the direction of arrow 18. In this way, a semiconductor arrangement 1 is obtained which emits light effectively parallel to the chip top 22.

As an alternative to the structure shown in FIG. 5a, other embodiments are also feasible, such as in FIG. 5b, where for instance the reflective layer 11 is only applied over the semiconductor chip 2 in the laterally middle region, such that the top of the radiation-transmissive body 3 remains free all around it. The radiation is in this way emitted divergently and rotationally symmetrically substantially laterally in the direction of arrow 18.

The semiconductor chip may for example optionally comprise ribbed outer faces, which improve out- or incoupling of light from the semiconductor chip 2 or indeed ensure a mechanically more stable connection with adhesive joint 4 or radiation-transmissive body 3. The body 3 may also be provided with such surface structuring.

In the exemplary embodiment according to FIG. 6 a plurality of semiconductor chips 2 are accommodated in the recesses 13 in the radiation-transmissive body 3. The semiconductor arrangement 1 comprises two electrical connection points 5, which are SMT-contactable and comprise electrical contacting to an external carrier, not shown, which may for instance take the form of a metal-core board. Between the semiconductor chips 2 electrical connections 12 are mounted, which are formed from a metal and, like the connection points 5, are adhesively bonded to the contact faces of the semiconductor chip 2 with a conductive adhesive. The connections 12 are thinner than the two connection points 5. Series connection of the semiconductor chips 2 is obtained as a result of this arrangement. The body 3 is again of lens-like configuration. A large lens may then be provided, or indeed a sublens for each semiconductor chip 2, depending on the optical imaging quality requirements. Various conversion media 7a, 7b, 7c may for instance be admixed with the adhesive joints 4.

In the exemplary embodiment according to FIG. 7 a semiconductor chip 2 is mounted on an intermediate carrier 9. The intermediate carrier 9 is substantially made from a thermally readily conductive ceramic material. The electrical connection points 5 are passed in a U-shape from the side remote from the semiconductor chip 2 to the side facing the semiconductor chip 2 and are SMT-contactable. The semiconductor chip 2 is electrically conductively adhesively bonded or soldered by the chip bottom 21 directly to one of the connection points 5 and connected to a further connection point 5 via a wire connection. The semiconductor chip 2 sits in a recess 19 in the intermediate carrier 9, such that the connecting wire is not damaged on adhesive bonding or insertion of the intermediate carrier 9 into the body 3.

As an alternative to the semiconductor chip 2 shown in FIG. 7, electrical contacting of which takes place on the chip top 22 or chip bottom 21, semiconductor chips 2 may also be used in a flip-chip arrangement. A plurality even of different types of semiconductor chips 2 emitting in different colours may also be mounted on the intermediate carrier 9 without major difficulties. The radiation-transmissive body 4 may for instance take the form of a cylinder lens.

In FIG. 8 a plurality of semiconductor arrangements 1, constructed according to FIG. 1, are arranged on a thermally conductive carrier 10. Since the semiconductor chips 2 do not comprise any further housing than the body 3, and the space requirement in the lateral direction 14 is thus restricted substantially to the lateral dimensions of the semiconductor chip 2, the semiconductor arrangements 1 may be packed at high density. The waste heat arising when the semiconductor chip 2 is in operation may be conveyed away efficiently via the electrical connection points 5 and via the thermally conductive carrier 10. Since, as described, no further housing is used, the thermal contact between the semiconductor chip 2 and the carrier 10 is very good, in particular if the electrical connection points 5 are of extensive, metallic construction. The individual semiconductor arrangements 1 may be mounted simply on the carrier 14 by SMT and readily positioned there on appropriately manufactured conductor tracks, not shown, and for instance soldered.

For high-density packing of the semiconductor arrangements 1 it is favourable for these to have for instance a square cross-section in plan view. Likewise favourable cross-sections would be for instance circular, rectangular or hexagonal shapes. Depending on requirements, the bodies 3 configured for instance as lenses may contain for instance different conversion media 7 or filter media 8, such that similar semiconductor chips 2 may be used and nonetheless different colours may be emitted by the individual semiconductor arrangements 1, such that overall a lighting device emitting white light or a display means emitting different colours, for example in conjunction with a liquid crystal mask, may be obtained. The SMT construction in particular makes intermediate steps such as wire bonding superfluous.

The semiconductor arrangement described herein is not restricted by the description given with reference to the exemplary embodiments. Rather, the invention encompasses any novel feature and any novel combination of features, including in particular any combination of features in the claims, even if this feature or this combination is not itself explicitly indicated in the claims or exemplary embodiments.

The invention claimed is:

1. A surface-mountable semiconductor arrangement comprising:
    a mounting side;
    at least one optoelectronic semiconductor chip with mutually opposing chip top and chip bottom;
    an at least partially radiation-transmissive body with a body bottom, on which the semiconductor chip is mounted in such a way that the chip top faces the body bottom;
    an at least partially radiation-transmissive adhesive joint with which the semiconductor chip and the body are connected together, and
    at least two electrical connection points for electrical contacting of the semiconductor arrangement,
    wherein the connection points do not project laterally beyond the body and delimit the semiconductor arrangement on the mounting side thereof with their side remote from the semiconductor chip,
    wherein the lateral extent of the body deviates by less than 40 percent from the lateral extent of the semiconductor chip,
    wherein the chip bottom is free of the adhesive joint,
    wherein the body comprises a recess in its body bottom, in which the semiconductor chip is located,
    wherein the electrical connection points are arranged on the chip bottom, and
    wherein a side of the electrical connection points facing the semiconductor chip ends flush with the body along a direction perpendicular to the chip bottom.

2. The semiconductor arrangement according to claim 1, wherein the adhesive joint is limited to the chip top.

3. The semiconductor arrangement according to claim 1, the connection points of which are SMT-contactable.

4. The semiconductor arrangement according to claim 1, wherein the connection points do not project laterally beyond the semiconductor chip.

5. The semiconductor arrangement according to claim 1, wherein the connection points are located directly on the chip bottom, oriented parallel thereto and metallic.

6. The semiconductor arrangement according to claim 1, wherein the chip bottom is freely accessible at least in places.

7. The semiconductor arrangement according to claim 1, wherein the body or the adhesive joint comprise at least one admixture in the form of at least one filter medium, conversion medium or scattering medium.

8. The semiconductor arrangement according to claim 7, wherein the admixture is distributed non-homogeneously in body or adhesive joint.

9. The semiconductor arrangement according to claim 7, wherein the adhesive joint has a non-homogeneous thickness.

10. The semiconductor arrangement according to claim 1, wherein the optical refractive index of the adhesive joint is lower than that of the body.

11. The semiconductor arrangement according to claim 1, further comprising at least one intermediate carrier, wherein the semiconductor chip is mounted on at least one intermediate carrier.

12. The semiconductor arrangement according to claim 1, wherein the body surrounds the semiconductor chip laterally at just two mutually opposing side faces so that a space requirement in the lateral direction is minimized and so that the semiconductor chip is positioned in the recess in the body.

13. The semiconductor arrangement according to claim 1, wherein the connection points end flush with the semiconductor chip in the lateral direction and wherein the semiconductor chip is a light-emitting diode.

* * * * *